(12) United States Patent
Wang et al.

(10) Patent No.: US 9,124,000 B2
(45) Date of Patent: Sep. 1, 2015

(54) CURRENT BREAKER AND WIRELESS COMMUNICATION DEVICE HAVING THE SAME

(71) Applicant: REALTEK SEMICONDUCTOR CORP., Hsinchu (TW)

(72) Inventors: Sy-Been Wang, Hsinchu County (TW); Chih-Pao Lin, Hsinchu County (TW); Ching-Wei Ling, Hsinchu County (TW)

(73) Assignee: Realtek Semiconductor Corp., Hsinchu (TW)

( * ) Notice: Subject to any disclaimer, the term of this patent is extended or adjusted under 35 U.S.C. 154(b) by 221 days.

(21) Appl. No.: 13/959,890

(22) Filed: Aug. 6, 2013

(65) Prior Publication Data

US 2014/0159985 A1    Jun. 12, 2014

(30) Foreign Application Priority Data

Dec. 12, 2012   (TW) .............................. 101146835 A

(51) Int. Cl.
| | |
|---|---|
| *H01Q 1/48* | (2006.01) |
| *H05K 1/02* | (2006.01) |
| *H01Q 1/24* | (2006.01) |
| *H01Q 1/52* | (2006.01) |
| *H01P 1/203* | (2006.01) |
| *H05K 1/16* | (2006.01) |

(52) U.S. Cl.
CPC ................. *H01Q 1/48* (2013.01); *H01Q 1/243* (2013.01); *H01Q 1/521* (2013.01); *H05K 1/0233* (2013.01); *H05K 1/0236* (2013.01); *H01P 1/20345* (2013.01); *H05K 1/0225* (2013.01); *H05K 1/0251* (2013.01); *H05K 1/16* (2013.01); *H05K 2201/09672* (2013.01); *H05K 2201/09781* (2013.01)

(58) Field of Classification Search
USPC .................................. 343/702, 848; 333/176
See application file for complete search history.

(56) References Cited

U.S. PATENT DOCUMENTS

| 7,501,583 B2 * | 3/2009 | Chao et al. .................... 174/255 |
| 7,911,394 B2 * | 3/2011 | Quintero Illera et al. ..... 343/700 MS |

(Continued)

OTHER PUBLICATIONS

Peter Lindberg and Erik Ojefors; A Bandwidth Enhancement Technique for Mobile Handset Antennas Using Wavetraps; IEEE Transactions on Antennas and Propagation, vol. 54, No. 8, Aug. 2006, pp. 2226-2233.

(Continued)

*Primary Examiner* — Tan Ho
(74) *Attorney, Agent, or Firm* — Rosenberg, Klein & Lee

(57) ABSTRACT

A current breaker comprises a multi-layer printed circuit board (PCB), a ground plane, a metal component and a conductive via hole. The ground plane is disposed in a first metal layer of the multi-layer PCB and comprises a slot forming inductive impedance. The slot comprises an extended portion. The metal component is disposed in a second metal layer of the multi-layer PCB. Capacitive impedance is formed between the metal component and the ground plane. The projection of the metal component on the ground plane and the extended portion of the slot partially overlap. The conductive via hole penetrates the multi-layer PCB to connect metal component with the ground plane. The first and the second metal layers are any two metal layers of the multi-layer PCB. The inductive impedance formed by the slot and the capacitive impedance formed between the metal component and the ground plane create a parallel LC equivalent circuit.

17 Claims, 11 Drawing Sheets

(56) References Cited

U.S. PATENT DOCUMENTS

2011/0309992 A1* 12/2011 Ali ............................... 343/848
2012/0229357 A1* 9/2012 Hung et al. ................... 343/848

OTHER PUBLICATIONS

Chi-Yuk Chiu, Chi-Ho Cheng, Ross D. Murch, and Corbett R. Rowell; Reduction of Mutual Coupling Between Closely-Packed Antenna Elements; IEEE Transactions and Propagation, vol. 55, No. 6, Jun. 2007, pp. 1732-1738.

Jung-Chieh Lu; "A New Microwave Miniaturized Ground-Plane Current Choke and Its Applications"; Master's Thesis; College of Electrical and Computer Engineering, National Chiao Tung University; Hsinchu, Taiwan; Aug. 2007. (Supplied With English Abstract).

Communication From the Taiwan Patent Office Regarding a Counterpart Foreign Application Dated (Taiwan Year 104) Jun. 23, 2015.

* cited by examiner

CURRENT BREAKER AND WIRELESS COMMUNICATION DEVICE HAVING THE SAME

BACKGROUND OF THE INVENTION

1. Field of the Invention

The present invention relates to an antenna; in particular, to current breakers of antenna structures and wireless communication devices having the same.

2. Description of Related Art

In general microwave circuits, electrical current flows along the edge of the ground plane of a substrate, resulting in additional radiation that interferes with the original characteristics of an antenna. Related designs of a current breaker were therefore incorporated in today's communication products, however, with a lack of practicality due to the need of a large area.

Reference is made to FIG. 1. FIG. 1 is a schematic view showing a traditional one quarter wavelength current breaker, and the proposed method is related to a traditional current breaker with one quarter wavelength. Please refer to the reference: Peter Lindberg and Erik Öjefors, "A Bandwidth Enhancement Technique for Mobile Handset Antennas Using Wavetraps," IEEE Transactions on Antennas and Propagation, vol. 54, No. 8, pp. 2226-2233, August 2006. The antenna 11 is arranged on top of the ground plane 10 as shown in FIG. 1 and the portion of the slash area is the projection of the antenna 11 on the substrate. In conventional designs, the ground plane 10 features the quarter-wavelength-resonance current distribution of the antenna 11. The design of adding the current breaker 12 to the end edge of the ground plane 10, or appropriately placing the current breaker 12 on the ground plane 10 could reduce the higher order resonance frequency originally provided by the ground plane 10, thereby increasing the original impedance bandwidth of the antenna 11. The main purpose of this design is to decrease by means of the current breaker 12 the higher order resonance frequency provided by the ground plane 10, so as to let the antenna operate in a broad bandwidth. However, in this manner it is unpractical and less useful since the component size of the current breaker 12 is roughly equal to quarter wavelength corresponding to the operation frequency, resulting in the need of a large area.

Reference is made to FIG. 2. FIG. 2 is another embodiment of the current breaker of prior art. Please refer to Reference: Chi-Yuk Chiu, Chi-Ho Cheng, Ross D. Murch and Corbett. R. Rowell, "Reduction of Mutual Coupling Between Close-Packed Antenna Elements, "IEEE Transactions on Antennas and Propagation, vol. 55, No. 8, pp. 1732-1738, June 2007", wherein a parallel LC resonant circuit is utilized to achieve a decoupling function between two antennas. A parallel LC resonant circuit could be constructed by a capacitor, formed by a plurality of slots 23 embedded in the ground plane 20, and an inductance is formed by the vertical thin trace 24 between the slots 23. When the antennas 21, 22 operate with the resonance frequency, the parallel LC resonant circuit forms an open circuit, thus the current flowing from antenna 21 to antenna 22 can be blocked and the coupling between the antennas 21 and 22 is reduced to achieve an effectively higher isolation. However, the occupied area of proposed architecture is too large. In practical application, a complete area of the ground plane will not be added to this design, so this design does not make a substantial contribution to the reduction of size of the components.

SUMMARY OF THE INVENTION

The object of the present invention is to provide a current breaker and a wireless communication device having the same. A parallel resonant LC circuit comprises inductors and capacitors of printed type and acts as an open circuit at a resonant frequency, thus the circuit could block the flowing of current along the edge of the ground plane on the substrate to achieve the efficacy of the current breaker.

In order to achieve the aforementioned objects, according to an embodiment of the present invention, a current breaker comprising a multilayer printed circuit board, a ground plane, a metal component and a conductive via hole is proposed. The ground plane is disposed in a first metal layer of the multilayer printed circuit board and comprises a slot, which is used for forming an inductive impedance. The slot comprises an extended portion. The metal component is disposed in a second metal layer of the multilayer printed circuit board, and a capacitive impedance is formed between the metal component and the ground plane. A projection of the metal component on the ground plane and the extended portion of the slot partially overlap. The conductive via hole penetrates the multilayer printed circuit board to connect the metal component with the ground plane. The first metal layer and the second metal layer are any two metal layers of the multilayer printed circuit board. The inductive impedance formed by the slot and the capacitive impedance formed between the metal component and the ground plane together create a parallel LC equivalent circuit.

According to an embodiment of the present invention, a current breaker is proposed to form an open circuit at a resonant frequency. The current breaker comprises a substrate, a ground plane, a metal component and a conductive via hole. The ground plane is disposed in a first surface of the substrate and comprises a slot, which is used for forming an inductive impedance. The slot comprises an extended portion. The metal component is disposed in a second surface of the substrate. The second surface is parallel to the first surface, a capacitive impedance is formed between the metal component and the ground plane, and a projection of the metal component on the ground plane and said extended portion of the slot partially overlap. The conductive via hole penetrates the substrate to connect the metal component with the ground plane. The inductive impedance formed by the slot and the capacitive impedance formed between the metal component and the ground plane together create a parallel LC equivalent circuit.

According to an embodiment of the present invention, a wireless communication device having current breakers is proposed and comprises a multilayer printed circuit board, an antenna and a plurality of current breakers. The antenna is disposed on the multilayer printed circuit board and adjacent to a side of the multilayer printed circuit board. A plurality of current breakers is formed on the multilayer printed circuit board and adjacent to the side of the multilayer printed circuit board. At least one of the current breakers comprises a ground plane, a metal component and a conductive via hole. The ground plane is disposed in a first metal layer of the multilayer printed circuit board and comprises a slot, which is used for forming an inductive impedance. The slot comprises an extended portion. The metal component is disposed in a second metal layer of the multilayer printed circuit board, a capacitive impedance is formed between the metal component and the ground plane, and a projection of the metal component on the ground plane and the extended portion of the slot partially overlap. The conductive via hole penetrates the multilayer printed circuit board to connect the metal component with the ground plane. The first metal layer and the second metal layer are any two metal layers of the multilayer printed circuit board. The inductive impedance formed by the slot and the capacitive impedance formed between the metal component and the ground plane together create a parallel LC equivalent circuit.

In summary, by means of an open circuit effect achieved by current breakers operated at a resonant frequency, the current breakers and the wireless communication device having the current breakers in the embodiment of the present invention could block current's flowing on the ground plane, so as to reduce the affect which the current on the ground plane has on the antenna.

In order to further the understanding regarding the present invention, the following embodiments are provided along with illustrations to facilitate the disclosure of the present invention.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended drawings.

[Embodiment of a Current Breaker and a Wireless Communication Device Having the Same]

The present invention proposes an innovative design of a wireless communication device having current breakers. The design incorporates an antenna and current breakers, wherein the antenna adopts the design of planar inverted-F antenna (PIFA); and a plurality of current breaker structures are jointed on two side edges of the ground plane thereof. The image current generated at the edges of the ground plane by the antenna body will provide the antenna with additional radiation, thereby interfering with the original characteristic of the antenna.

Figure 1:
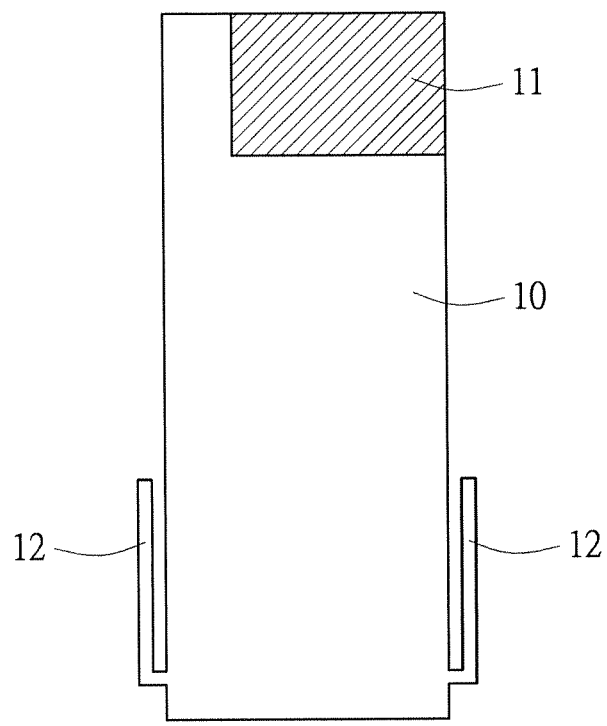
FIG. 1 is a schematic view showing a traditional one quarter wavelength current breaker.
Figure 2:
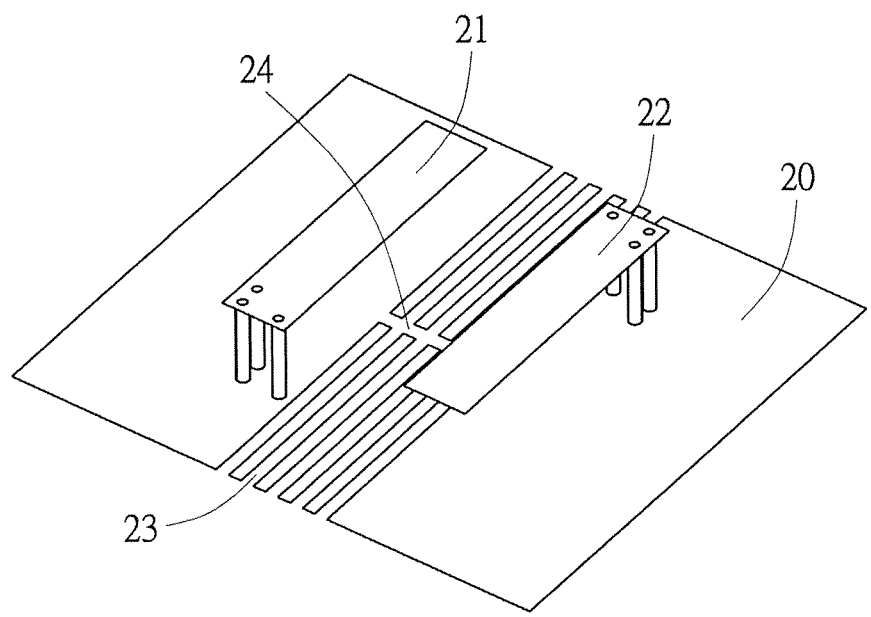
FIG. 2 is a schematic view showing a traditional current breaker.
Figure 3A:
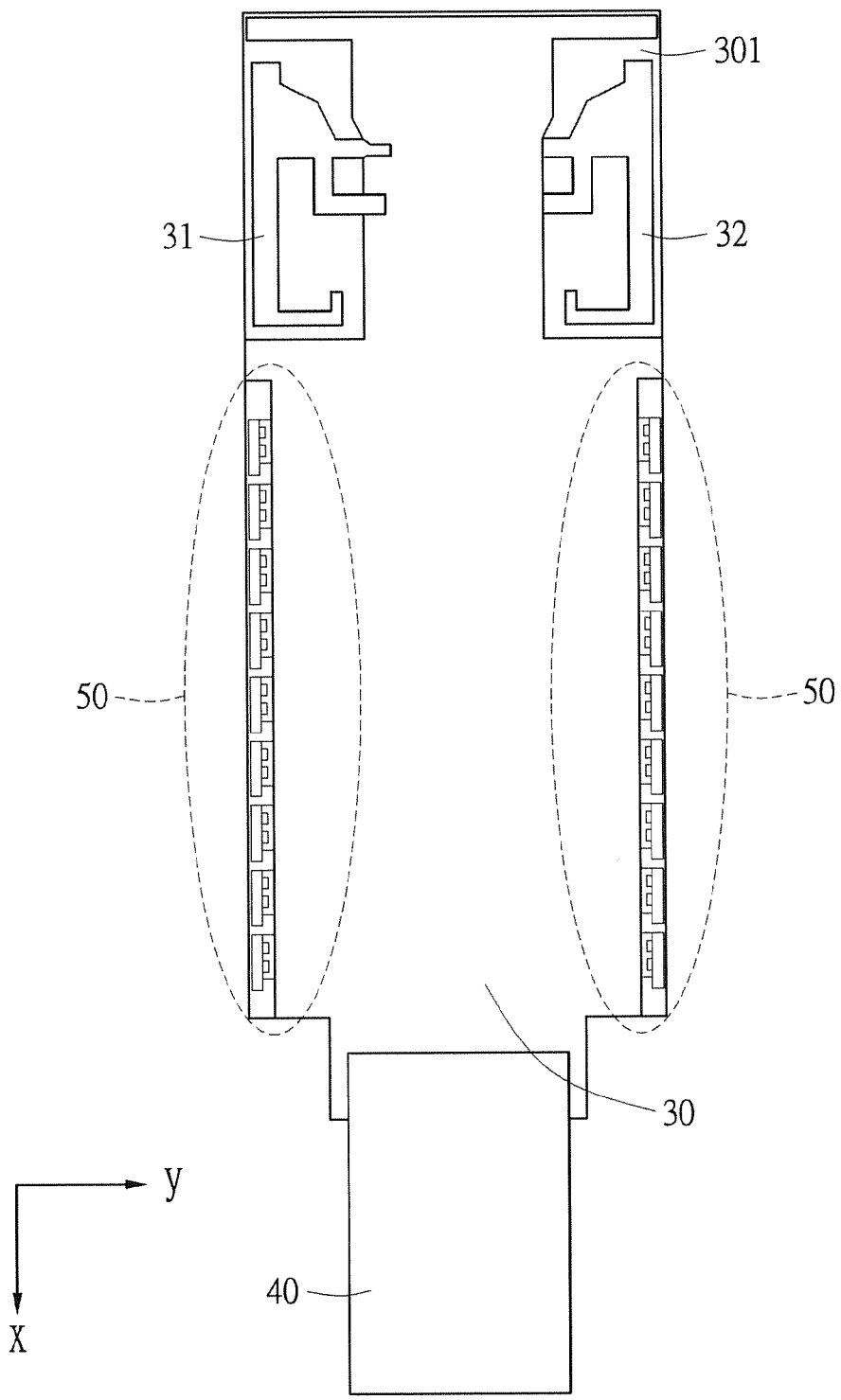
FIG. 3A is a schematic view showing a wireless communication device with current breakers according to an embodiment of the present invention.

FIG. 3A is a schematic view showing a wireless communication device with current breaker according to an embodiment of the present invention. The wireless communication device 3 with current breaker comprises a substrate 301, a first antenna 31, a second antenna 32, a plurality of current breakers 50 and a data transmission port 40. The current breakers 50 form an open circuit at a resonance frequency.

The first antenna 31 and the second antenna 32 are disposed on the substrate 301 and adjacent to the sides of the substrate 301. To describe in more detail, the first antenna 31 is disposed on the left side of the substrate 301 (toward the −y-axis direction), and the second antenna 32 is disposed on the right side of the substrate 301 (toward the +y-axis direction). A plurality of current breakers 50 are arranged on the substrate 301, and adjacent to said sides of the substrate 301. The data transmission port 40 is disposed on the substrate 301, and the communication circuit, the control circuit and related data transmission circuit of the wireless communication device 3 are not illustrated for the sake of brevity. The data transmission port 40 may be in line with the specification of the data transmission port such as Universal Serial Bus (USB). The wireless communication device 3 could be disposed on a personal computer, a notebook or an electronic device such as other digital media processor (DMP), a Set-Top-Box (STB) and so on.

The substrate 301 may be a printed circuit board such as a double-sided printed circuit board or a printed circuit board of multilayer structure; however, the type of substrate associated with the present invention is not limited thereto. In the present embodiment, the first antenna 31 and the second antenna 32 are coupled to the input of a radio frequency circuit (not illustrated) on the substrate 301 and realized with inverted-F antennas of a printed type.

Figure 3B:
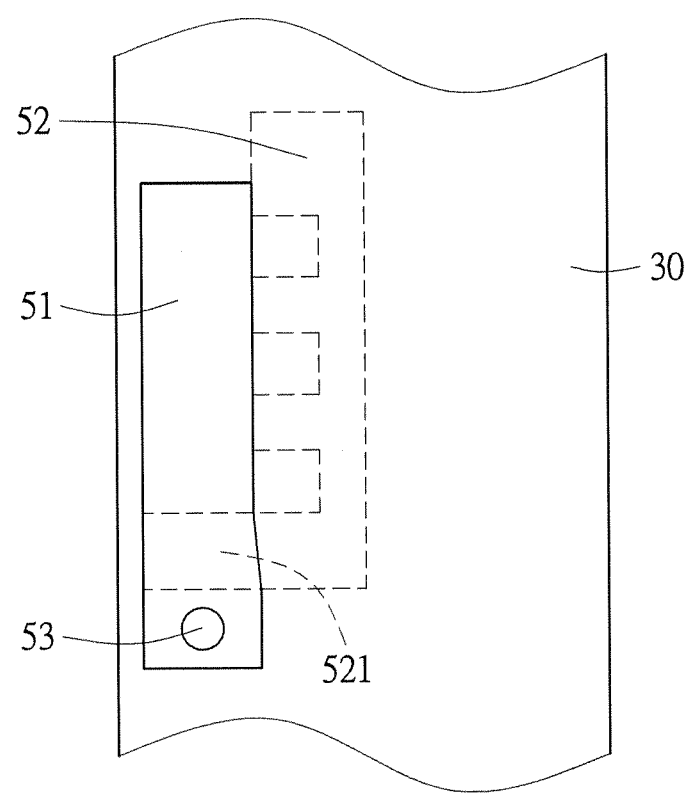
FIG. 3B to FIG. 3G are schematic views showing the current breaker according to an embodiment of the present invention.

Please refer to FIGS. 3A and 3B. FIG. 3B is a schematic view showing a current breaker unit according to an embodiment of the present invention. The current breaker 50 comprises a ground plane 30, a metal component 51, a conductive via hole 53 and a part of the substrate 301. For the convenience of explanation, in the present embodiment, the part of the substrate 301 between the ground plane 30 and the metal component 51 is also included in the element of the current breaker 50.

Please refer to FIG. 3A and FIG. 3B again. When the substrate 301 is a multilayer printed circuit board, the current breaker 50 includes a multilayer printed circuit board (substrate 301), a ground plane 30, a metal component 51 and a conductive via hole 53. The ground plane 30 is disposed in a first metal layer of the multilayer printed circuit board, and includes a slot 52, and the slot 52 is used for forming an inductive impedance. The slot 52 comprises an extended portion 521. The metal component 51 is disposed in the second metal layer of the multilayer printed circuit board, and a capacitive impedance is formed between the metal component 51 and the ground plane 30. The projection of the metal component 51 on the ground plane 30 and the extended portion 521 of the slot 52 partially overlap. The conductive via hole 53 penetrates the multilayer printed circuit board to connect the metal component 51 with the ground plane 30. The first metal layer and the second metal layer may be any two metal layers in the multilayered printed circuit board. The inductive impedance formed by the slot 52 and the capacitive impedance formed between the metal component 51 and the ground plane 30 together create a parallel LC equivalent circuit. The parallel LC equivalent circuit corresponds to a resonance frequency, at which the current breakers 50 form an open circuit.

When the substrate 301 is a double-sided printed circuit board, the ground plane 30 and the metal component 51 could be respectively formed on the upper surface and the lower surface of the substrate 301. In more detail, the ground plane 30 is disposed on the first surface (or so-called the upper surface) of the substrate 301, and has the slot 52 used for penetrating the substrate. The slot 52 is used for forming an inductive impedance, and includes an extending portion 521. The metal component 51 is disposed on the second surface (or so-called the lower surface) of the substrate 301, and the first surface and the second surface are parallel to each other. The capacitive impedance is formed between the metal component 51 and the ground plane 30, and the projection of the metal component 51 on the ground plane 30 and the extended portion 521 of the slot 52 partially overlap. The conductive via hole 53 penetrates the substrate 301 to connect the metal component 51 with the ground plane 30. The inductive impedance formed by the slot 52 and the capacitive impedance formed between the metal component 51 and the ground plane 30 together create a parallel LC equivalent circuit.

The shape of the metal component 51 may be rectangular, square, circular, oval, trapezoidal or polygonal. The shape of the metal component 51 is not limited to the embodiment, so long as the projection of the metal component 51 on the ground plane 30 could cover the extended portion 521 of the slot 52 partially. Further, not only the metal component 51 could be made through a manufacturing process of the printed circuit board, the metal component 51 itself may also be a capacitor in order to enhance the capacitive impedance of the metal component 51. As for the operation at a lower frequency, when a larger value of capacitance or inductance is required, lumped elements may be used to achieve a large capacitance, and a magnetic material could be added to the metal component 51, the conductive via hole 53, or the ground plane 30 to achieve a large inductance. For example, the metal component 51 may be made of magnetic material, or the conductive via hole 53 may be filled with magnetic material, or the ground plane 30 may be made of magnetic material. Alternatively, the peripheral boundary of the slot 52 is formed by magnetic material; however, the present invention is not limited thereto.

Figure 3C:
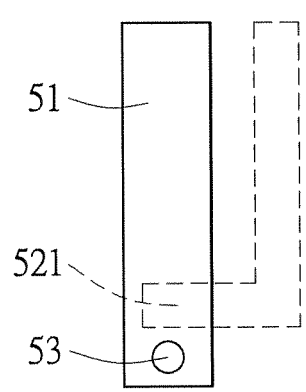
Figure 3D:
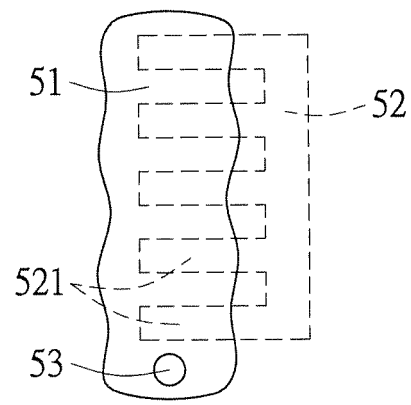
Figure 3E:
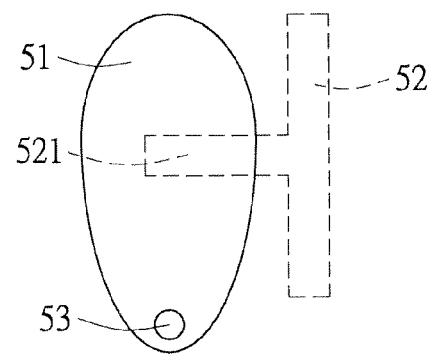
Figure 3F:
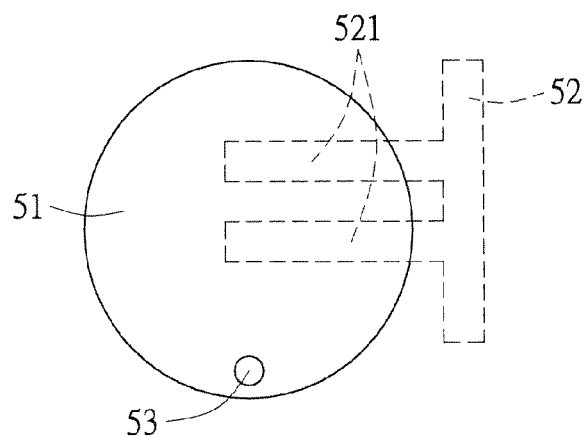
Figure 3G:
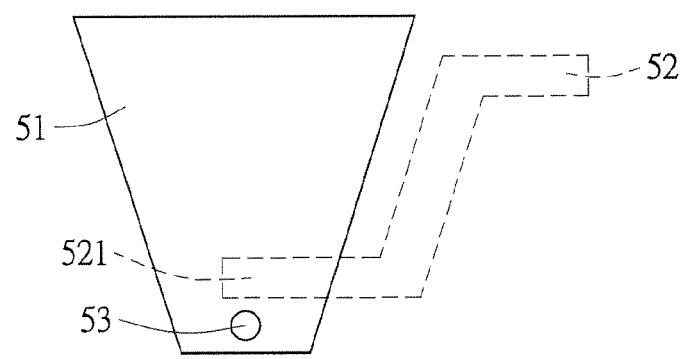

Please also refer to FIG. 3B to FIG. 3G FIG. 3B to FIG. 3G are the schematic diagrams showing the current breaker unit of the embodiment in the present invention. The metal component 51 may be a rectangular metal sheet, a circular metal sheet, an oval metal sheet or a trapezoidal metal sheet and so on; however, in the present invention the shape of the metal component 51 is not limited thereto. In addition to having the extended portion 521 (a part of the extended portion 521 overlaps with the projection of the metal element 51), the shape of the slot 52 may be L-shaped, comb-shaped or T-shaped and so on. The shape of the slot 52 is not limited to the embodiment. As shown in FIG. 3C, the slot 52 is an L-shaped slot. As shown in FIG. 3D, the shape of the metal element 51 is a polygon, and the slot 52 is a plurality of L-shaped slots overlapped with each other to form a comb-shaped slot. As shown in FIG. 3E, the metal component 51 is an oval metal sheet, and the slot 52 is a T-shaped slot. As shown in FIG. 3F, the metal component 51 is a circular metal sheet, and the slot 52 is a double T-shaped slot. As shown in FIG. 3G, the metal element 51 is a trapezoid-shaped metal sheet, and the slot 52 is a N-shaped slot (which is laterally placed). It is common for FIG. 3B to FIG. 3G that the slot 52 has an extended portion 521 partially covered by the projection of the metal component 51. Further, the amount of extended portion 521 may also be plural. As shown in FIG. 3D, there are five extended portions 521, or as shown in FIG. 3F, there are two extended portions 521.

In other words, a current breaker presenting a state of high impedance at the resonance frequency could be regarded as an open circuit, thus the function of blocking current flow can be achieved. The space between the metal component 51 and the ground plane 30 could be regarded as a parallel plate capacitor, while the slots 52 embedded in the ground plane 30 may be regarded as an inductor. Therefore, when the current on the ground plane 30 flows through this current breaker, part of the current will pass via the conductive via hole 53 and flow through the metal element 51, and the other part of the current will flow through the slot 52, resulting in being equivalent to seeing a parallel LC circuit, which may be regarded as an open circuit at the resonant frequency, thereby effectively blocking current flow. At the same time, the resonance frequency may also be changed by changing the relevant dimensions of this current breaker 50, and the function of blocking the current at different frequencies could be achieved. The current breaker 50 proposed in the present embodiment may be applied in microwave-related systems, for example, in blocking RF signal leaking to the power supply signal terminal in a microwave circuit, decoupling between multi-antennas, improving antenna radiation pattern, increasing impedance bandwidth and the antenna gain, etc.

Please refer to FIG. 3A. The size of the ground plane 30 of existing wireless communication products is usually larger in size when compared to the main body of antennas (first antenna 31 and second antenna 32). For instance, the ground plane has a longer length. Taking the antenna operating at a frequency of 5 GHz as an example, if the wireless communication device is a USB wireless network card (or USB dongle), the length of the long side of the ground plane is around 50 mm, which is one wavelength corresponding to the frequency of 5 GHz. Therefore, the traveling wave of the image current along direction of +x-axis generated by induction from the antenna main body in the edge of the ground plane (as shown in FIG. 3A, toward the left side of −y-axis, or toward right side of +y-axis) provides additional contribution of radiation, thereby skewing the radiation pattern of the antenna towards the direction of +x-axis. As described above, the current breaker proposed in the present invention could be applied to the correction of antenna pattern, thereby improving the problem of destruction of the original antenna radiation characteristics resulted from radiation of image current in the edge of the ground plane.

Figure 4A:
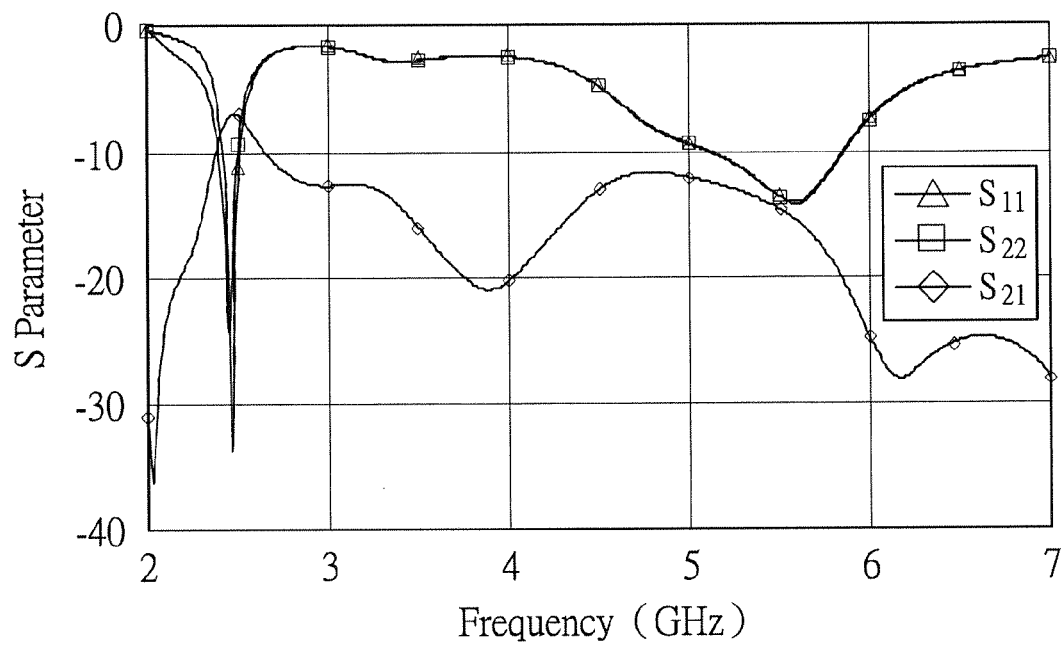
FIG. 4A shows S-parameters frequency response plots of antenna of a wireless communication device without current breaker according to an embodiment of the present invention.
Figure 4B:
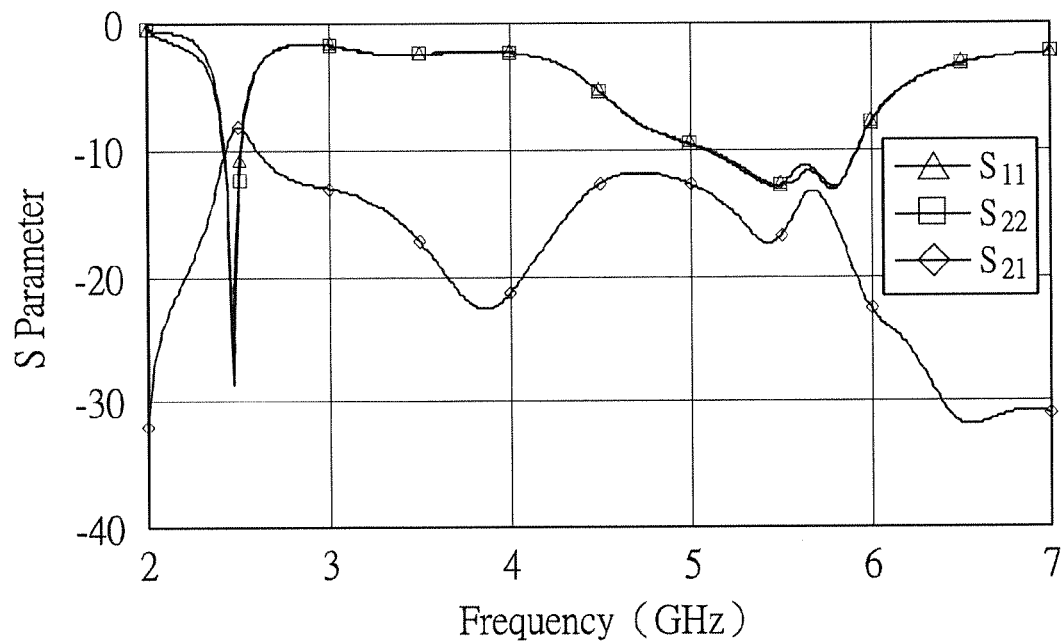
FIG. 4B shows S-parameters frequency response plots of antenna of a wireless communication device with current breaker according to an embodiment of the present invention.

Please also refer to FIG. 4A and FIG. 4B. FIG. 4A shows S-parameters frequency response plots of the antenna of a wireless communication device without a current breaker illustrated according to an embodiment of the present invention. FIG. 4B shows S-parameters frequency response plots of the antenna of a wireless communication device with a current breaker illustrated according to an embodiment of the present invention. As shown in FIG. 4B, when the current breaker is added, the S-parameter S11 of the first antenna 31 and the S-parameter S22 of the second antenna 32 are not affected by the current breaker. In other words, impedance matching characteristics of the antenna (including the first antenna 31 and the second antenna 32) remain unchanged and can include two bands 2 GHz/5 GHz, thus implementing dual-frequency operation.

Figure 5A:
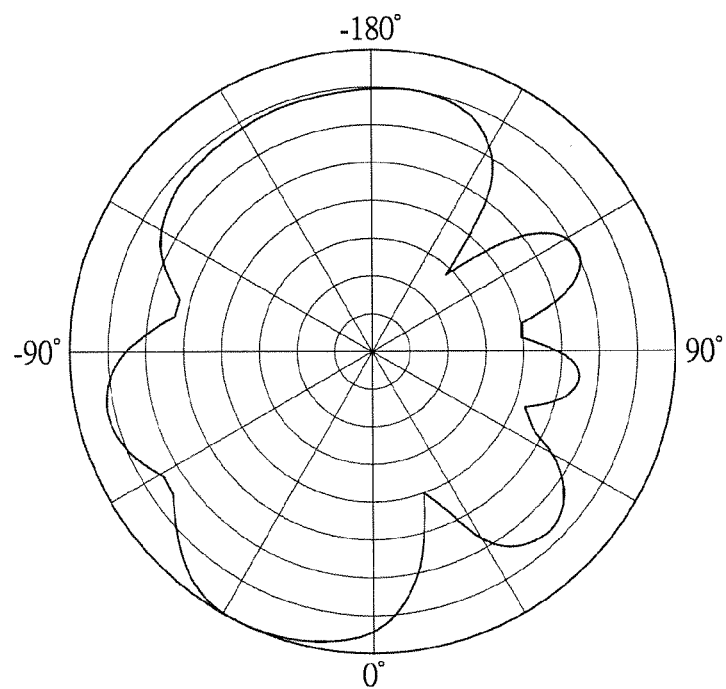
FIG. 5A shows a radiation pattern of the first antenna without current breaker according to an embodiment of the present invention.
Figure 5B:
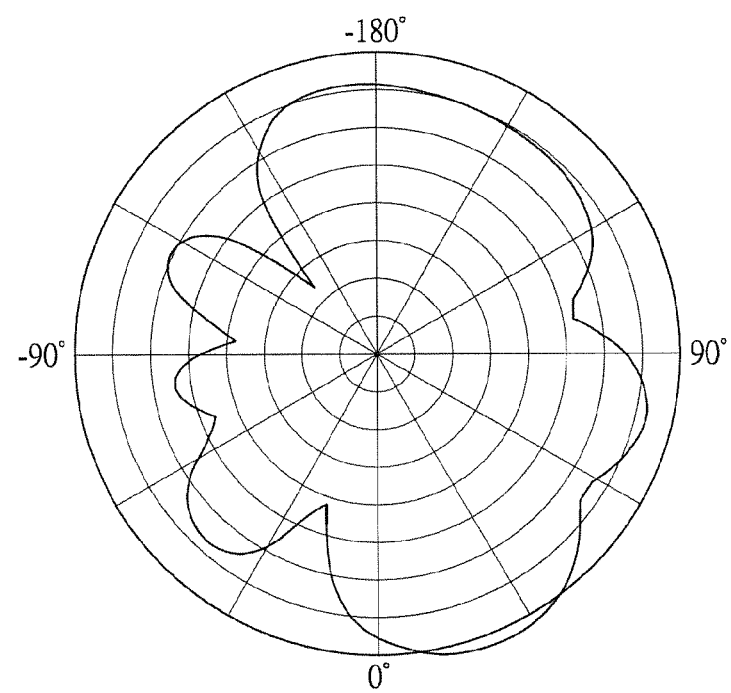
FIG. 5B shows a radiation pattern of the second antenna without current breaker according to an embodiment of the present invention.
Figure 6A:
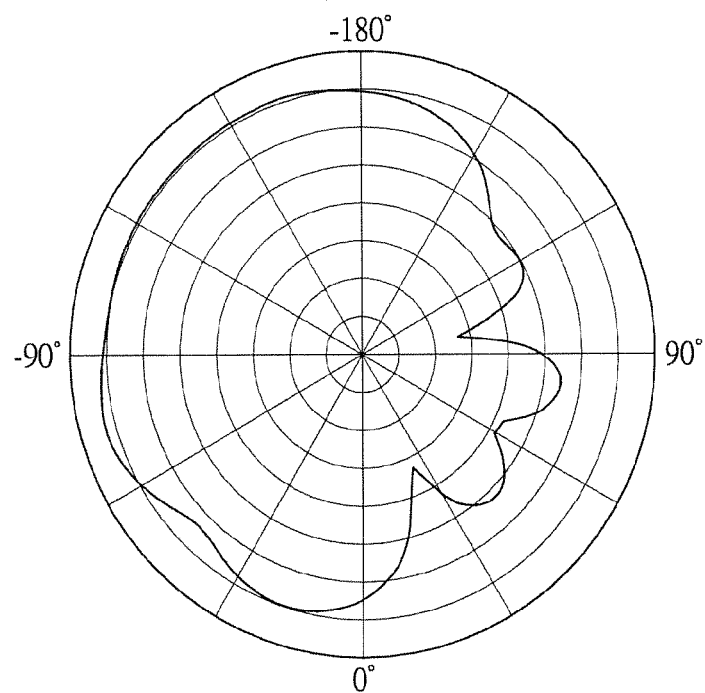
FIG. 6A shows a radiation pattern of the first antenna with current breaker according to an embodiment of the present invention.
Figure 6B:
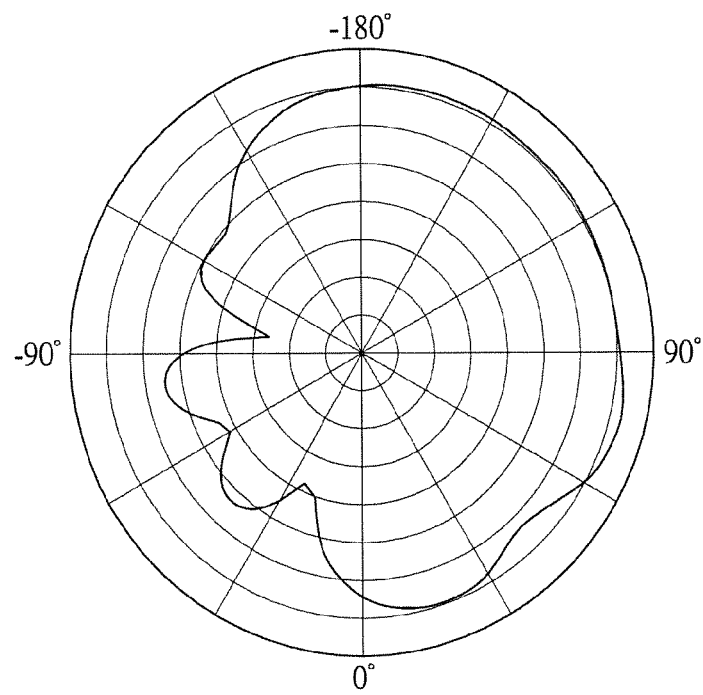
FIG. 6B shows a radiation pattern of the second antenna with current breaker according to an embodiment of the present invention.

Please also refer to FIG. 3A、FIG. 5A、FIG. 5B、FIG. 6A and FIG. 6B. FIG. 5A shows a radiation pattern diagram of the first antenna without a current breaker illustrated according to an embodiment of the present invention. FIG. 5B shows a radiation pattern diagram of the second antenna without a current breaker illustrated according to an embodiment of the present invention. FIG. 6A shows a radiation pattern diagram of the first antenna with a current breaker illustrated according to an embodiment of the present invention. FIG. 6B shows a radiation pattern diagram of the second antenna with a current breaker illustrated according to an embodiment of the present invention.

The directions of 0 degree and 90 degree in the radiation pattern diagram of FIG. 3A represents the directions of +x and +y, respectively. From FIG. 5A and FIG. 5B, the radiation patterns of the first antenna 31 and the second antenna 32 both shift toward the direction (+x direction) of the ground plane. On the other hand, the influence on the antenna radiation pattern (x-y plane) caused by the current breaker could be seen from FIG. 6A and FIG. 6B. When the current breaker is added, the radiation intensity along the direction of +x-axis decreases, resulting in an improvement of the skewed radiation pattern.

Figure 7:
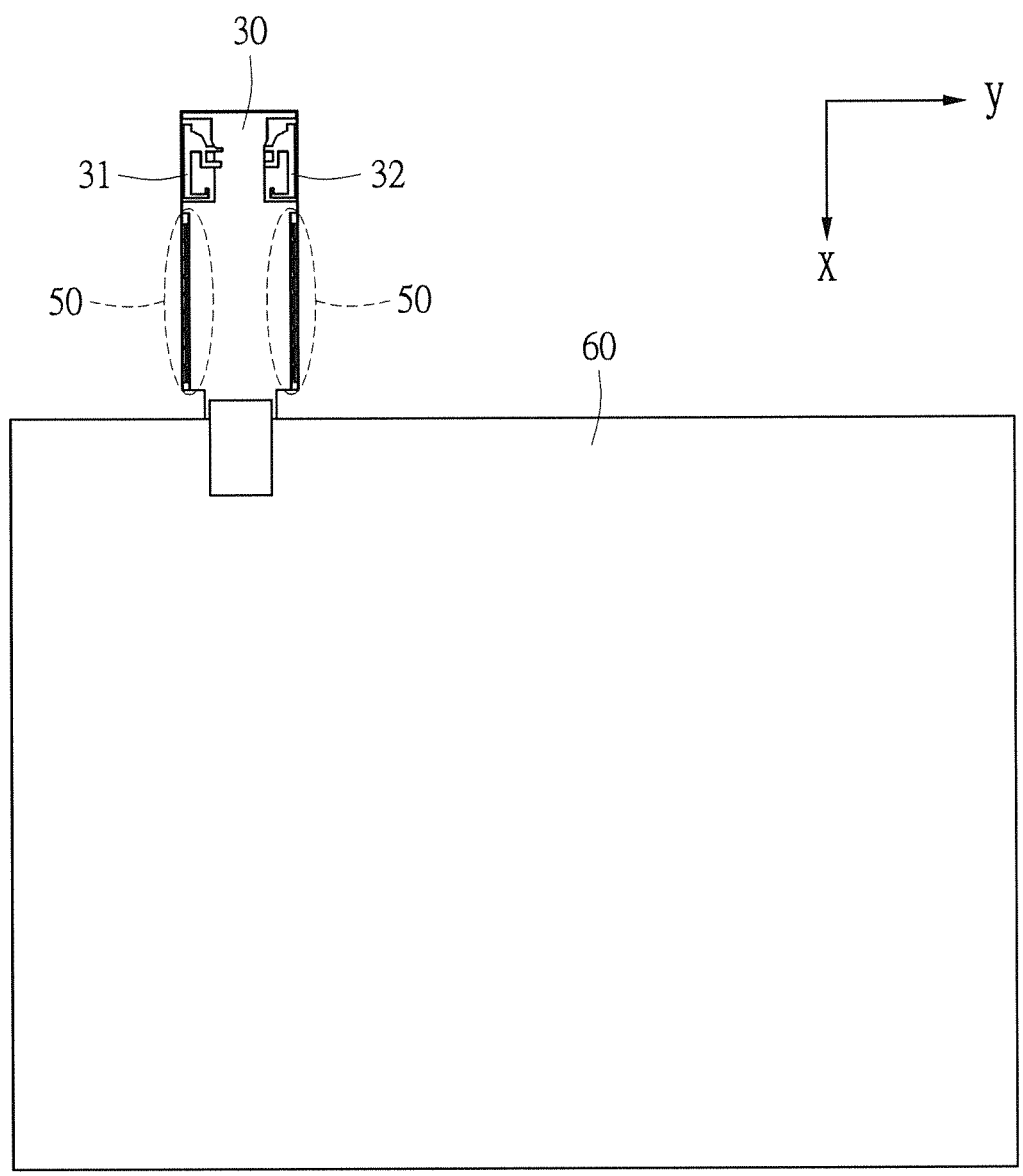
FIG. 7 is a schematic view showing a wireless communication device with current breaker disposed in a metal ground plane of a large area according to another embodiment of the present invention.

Please also refer to FIG. 3A and FIG. 7. FIG. 7 is a schematic view showing a wireless communication device with current breaker disposed in a large area metal ground plane illustrated according to another embodiment of the present invention. When the wireless communication device 3 having current breaker 50 is disposed on the large area metal ground plane 60, the metal ground plane can be a personal computer (PC), a notebook (NB), a digital media processor (DMP), a Set-Top Box (STB), or any electronic device motherboard (main board) with a Universal Serial Bus (USB).

Figure 8A:
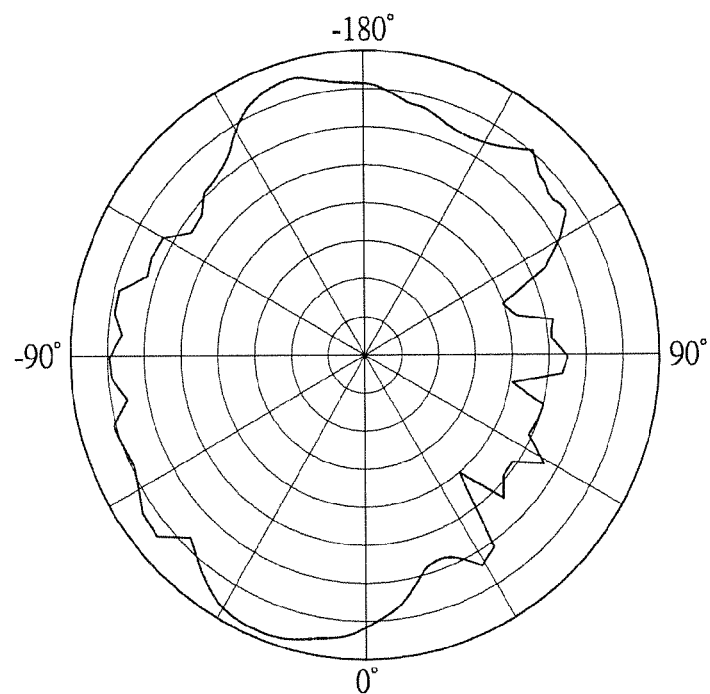
FIG. 8A shows a radiation pattern of the first antenna without current breaker according to another embodiment of the present invention.
Figure 8B:
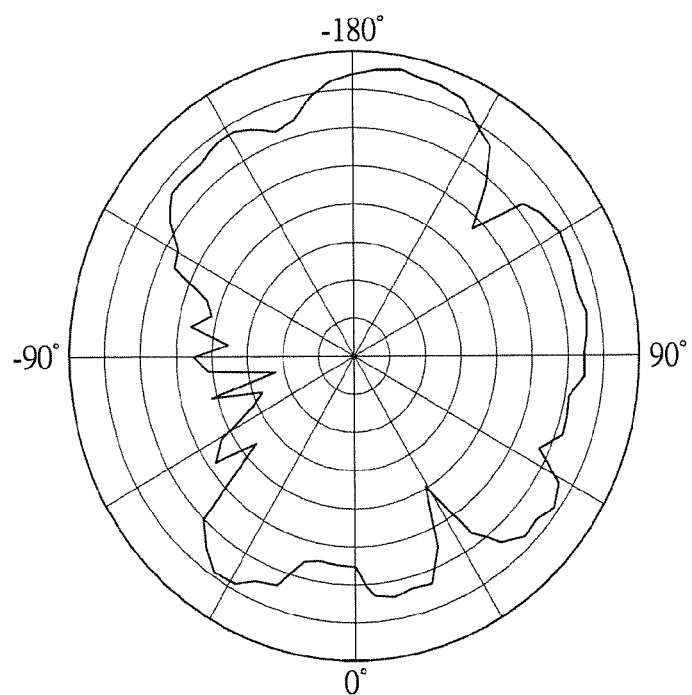
FIG. 8B shows a radiation pattern of the second antenna without current breaker according to another embodiment of the present invention.
Figure 9A:
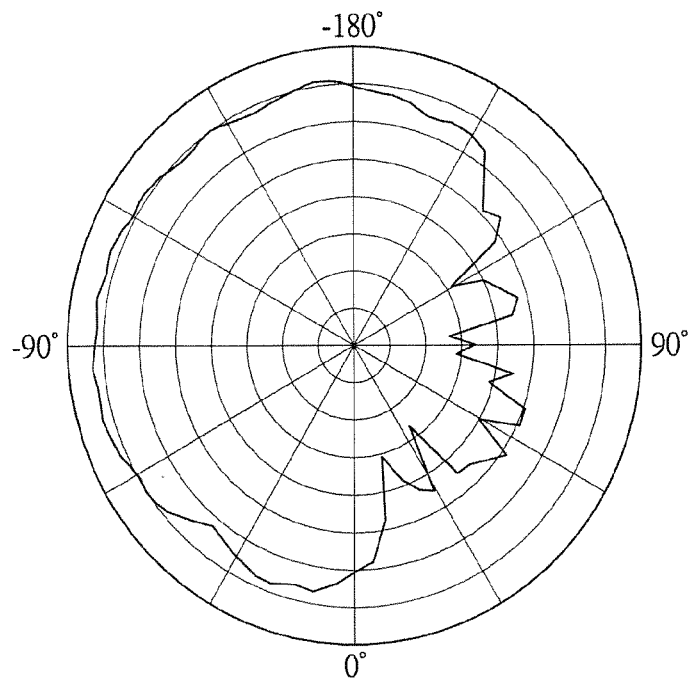
FIG. 9A shows a radiation pattern of the first antenna with current breaker according to another embodiment of the present invention.
Figure 9B:
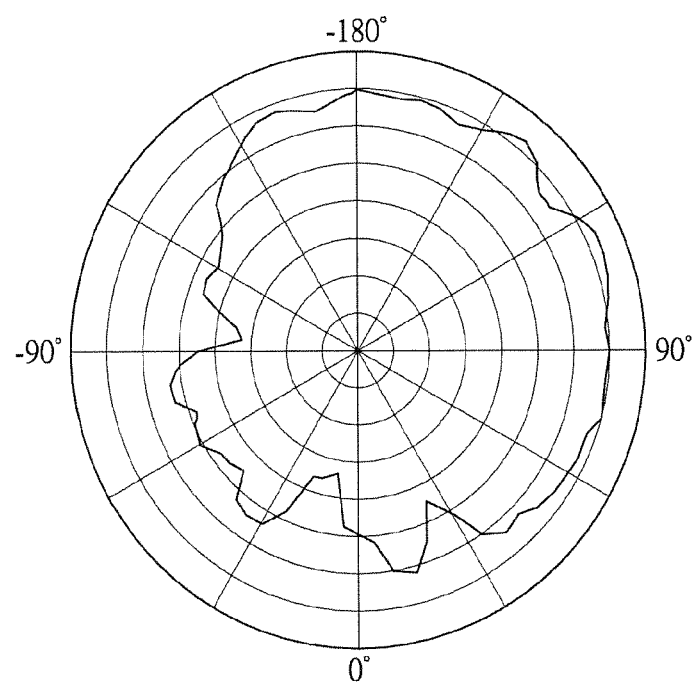
FIG. 9B shows a radiation pattern of the second antenna with current breaker according to another embodiment of the present invention.

Please also refer to FIG. 8A, FIG. 8B, FIG. 9A and FIG. 9B. FIG. 8A and FIG. 8B show radiation patterns of the first antenna and the second antenna without a current breaker illustrated according to another embodiment of the present invention. FIG. 9A and FIG. 9B show radiation patterns of the first antenna and the second antenna with a current breaker illustrated according to another embodiment of the present invention. As can be seen from FIG. 9A and FIG. 9B, when current breakers 50 are added, the radiation intensity along the direction of +x-axis decreases, resulting in of the improvement of skewed radiation patterns. The reason is because the current breakers 50 blocked the current that may have flowed to the large metal ground plane 60 connected with the wireless communication device 3.

[Efficacy of Embodiment in the Present Invention]

According to the embodiments in the present invention, the main purpose of aforesaid wireless communication device having a current-blocking structure consists in utilizing the printed inductor and capacitor to compose a parallel resonant LC circuit, which is an open circuit of high impedance at a resonance frequency and thus can block current flow along the edge of the ground plane on a substrate, so as to operate as a current breaker. When the wireless communication device is to be connected to an electronic device larger in size, such as a personal computer (PC), a notebook (NB), a digital media processor (DMP), a Set-Top Box (STB) and so on, the influence on the pattern radiation of the antenna caused by the large metal ground plane of the electronic device could be effectively reduced. In addition, the wireless communication device with a current breaker proposed in the present invention could be designed and implemented entirely in printed form and has advantages including easier production and lower cost, making it applicable for industrial use and advancement.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A current breaker comprises:
   a multilayer printed circuit board;
   a ground plane being disposed in a first metal layer of said multilayer printed circuit board, wherein said ground plane comprises a slot and said slot comprises an extended portion;
   a metal component being disposed in a second metal layer of said multilayer printed circuit board, wherein a projection of said metal component on said ground plane and said extended portion of said slot partially overlap; and
   a conductive via hole penetrating the multilayer printed circuit board to connect the metal component with the ground plane;
   wherein said first metal layer and said second metal layer are any two metal layers of the multilayer printed circuit board, and an inductive impedance formed by said slot and a capacitive impedance formed between said metal component and said ground plane create a parallel LC equivalent circuit.

2. The current breaker according to claim 1, wherein said parallel LC equivalent circuit corresponds to a resonance frequency at which said current breaker forms an open circuit.

3. The current breaker according to claim 1, wherein the shape of said slot is L-shaped, comb-shaped or T-shaped.

4. The current breaker according to claim 1, wherein the shape of said metal component is rectangular, circular, oval, trapezoidal or polygonal.

5. The current breaker according to claim 1, wherein said metal component, said conductive via hole or said ground plane comprises magnetic material.

6. The current breaker according to claim 1, wherein the peripheral boundary of said slot comprises magnetic material.

7. A current breaker comprises:
   a substrate;
   a ground plane being disposed in a first surface of said substrate, wherein said ground plane comprises a slot and said slot comprises an extended portion;
   a metal component disposed in a second surface of said substrate, wherein a projection of said metal component on said ground plane and said extended portion of said slot partially overlap; and
   a conductive via hole penetrating the substrate to connect the metal component with the ground plane;
   wherein an inductive impedance formed by said slot and a capacitive impedance formed between said metal component and said ground plane create a parallel LC equivalent circuit.

8. The current breaker according to claim 7, wherein said parallel LC equivalent circuit corresponds to a resonance frequency at which said current breaker forms an open circuit.

9. The current breaker according to claim 7, wherein said metal component is a capacitor.

10. The current breaker according to claim 7, wherein said metal component, said conductive via hole or said ground plane comprises magnetic material.

11. The current breaker according to claim 7, wherein the peripheral boundary of said slot comprises magnetic material.

12. A wireless communication device having current breakers comprises:
   a multilayer printed circuit board;
   an antenna disposed on said multilayer printed circuit board and adjacent to a side of said multilayer printed circuit board; and
   a plurality of current breakers formed on said multilayer printed circuit board and adjacent to the side of said multilayer printed circuit board, at least one of the plurality of current breaker comprises:
   a ground plane being disposed in a first metal layer of said multilayer printed circuit board, wherein said ground plane comprises a slot and said slot comprises an extended portion;
   a metal component being disposed in a second metal layer of said multilayer printed circuit board, wherein a projection of said metal component on said ground plane and said extended portion of said slot partially overlap; and
   a conductive via hole penetrating the multilayer printed circuit board to connect the metal component with the ground plane;
   wherein said first metal layer and said second metal layer are any two metal layers of the multilayer printed circuit board, and an inductive impedance formed by said slot and a capacitive impedance formed between said metal component and said ground plane create a parallel LC equivalent circuit.

13. The wireless communication device having current breakers according to claim 12, wherein said parallel LC equivalent circuit corresponds to a resonance frequency at which said current breaker forms an open circuit.

14. The wireless communication device having current breakers according to claim 12, wherein the shape of said slot is L-shaped, comb-shaped or T-shaped.

15. The wireless communication device having current breakers according to claim 12, wherein the shape of said metal component is rectangular, circular, oval, trapezoidal or polygonal.

16. The wireless communication device having current breakers according to claim 12, wherein said metal component, said conductive via hole or said ground plane comprises magnetic material.

17. The wireless communication device having current breakers according to claim 12, wherein the peripheral boundary of said slot comprises magnetic material.

* * * * *